(12) United States Patent
Park et al.

(10) Patent No.: US 7,868,541 B2
(45) Date of Patent: Jan. 11, 2011

(54) WHITE LIGHT EMITTING ORGANIC ELECTROLUMINESCENT DEVICE

(75) Inventors: Ho-Cheol Park, Seongnam-shi (KR); Cheol-Kyu Choi, Gwangju (KR); Jong-Wook Park, Seoul (KR); Ji-Bum Yang, Yongin-shi (KR)

(73) Assignee: Doosan Corporation, Seoul (KR)

( * ) Notice: Subject to any disclaimer, the term of this patent is extended or adjusted under 35 U.S.C. 154(b) by 313 days.

(21) Appl. No.: 12/158,380

(22) PCT Filed: Dec. 22, 2006

(86) PCT No.: PCT/KR2006/005687

§ 371 (c)(1), (2), (4) Date: Jun. 20, 2008

(87) PCT Pub. No.: WO2007/073124

PCT Pub. Date: Jun. 28, 2007

(65) Prior Publication Data

US 2009/0001882 A1    Jan. 1, 2009

(30) Foreign Application Priority Data

Dec. 23, 2005   (KR) .................... 10-2005-0128976

(51) Int. Cl.
*H01J 1/62* (2006.01)

(52) U.S. Cl. ........................ 313/504; 313/506

(58) Field of Classification Search ............ 313/498, 313/504, 506
See application file for complete search history.

(56) References Cited

U.S. PATENT DOCUMENTS

| 6,777,871 B2 * | 8/2004 | Duggal et al. ............... 313/506 |
| 6,967,062 B2 | 11/2005 | Hatwar et al. |
| 2004/0241491 A1 | 12/2004 | Hatwar |

FOREIGN PATENT DOCUMENTS

| JP | 2000058259 A | 2/2000 |
| JP | 2002-260859 A | 9/2002 |
| JP | 2004-031214 A | 1/2004 |

OTHER PUBLICATIONS

Japanese Office Action issued in corresponding Japanese Patent Application No. 2008-547116, dated Jun. 29, 2010.

* cited by examiner

*Primary Examiner*—Vip Patel
(74) *Attorney, Agent, or Firm*—Sughrue Mion, PLLC

(57) ABSTRACT

Provided is a white light emitting organic electroluminescent device, which includes a transparent substrate, a first element, and a second element, wherein the first element includes a first anode, a first element organic layer, and a reflective cathode sequentially disposed on a first substrate of the transparent substrate, and wherein the second element includes a second anode, a second element organic layer, and a transparent or translucent cathode sequentially disposed on a second surface of the transparent substrate.

16 Claims, 14 Drawing Sheets

WHITE LIGHT EMITTING ORGANIC ELECTROLUMINESCENT DEVICE

TECHNICAL FIELD

The present invention relates to a white light emitting organic electroluminescent device. More particularly, the present invention relates to a high efficiency white light emitting organic electroluminescent device that includes at least two color electroluminescent layers combined in parallel.

BACKGROUND ART

Organic electroluminescent devices have advantages that they do not require a backlight because they emit light on their own, differently from a liquid crystal display (LCD), and they can be manufactured to have a thickness of less than several nanometers to be used as thin and light display devices.

The organic electroluminescent devices are also drawing attention as next-generation display devices because the structure and manufacturing process of the organic electroluminescent devices are relatively simple and the production cost is low.

Particularly, since the organic electroluminescent devices have high luminous efficiency and low driving voltage, they consume a small amount of power. Since they have a fast pixel response rate, they can present high-quality video. When the organic electroluminescent devices are applied to color display devices, colors are realized with excellent quality and the color display devices are light, thin, and small, which results in high-quality display elements of portable information communication devices.

Colors are realized in the organic electroluminescent devices with the following methods: a side-by-side deposition method, a color change media (CCM) method, and a color filtering method. The side-by-side deposition sequentially deposits red (R), green (G), and blue (B) electroluminescent layers by using a delicately patterned metal mask based on minute transfer of the mask. The CCM method realizes green and red colors based on energy down-conversion of blue color. The color filtering method realizes colors by using a color filter and a white light emitting diode.

Among them, the color filtering method uses a shadow mask of which the entire light emitting area is exposed, instead of the delicately patterned metal mask required in the side-by-side deposition method. Thus, the color filtering method is an efficient manufacturing method and it yields a low defect rate. Therefore, the color filtering method can reduce the production cost.

Due to the advantages with respect to manufacturing process and cost, researchers are actively studying a white light emitting organic electroluminescent device using a color filter for a full-color display. The organic white light is also drawing attention as an environment-friendly light source, because it can replace the conventionally used gas-filled lamps using heavy metal elements or environmentally hazardous gas, such as mercury lamps and fluorescent lamps.

According to the conventional technology for realizing white light emitting organic electroluminescent devices, there are an organic electroluminescent device using colors in complementary relationships such as deep blue and yellow, and sky blue and red, which is shown in FIG. 1, and an organic electroluminescent device realizing white light by appropriately mixing three primary colors, i.e., blue, green, and red, which is shown in FIG. 2.

In short, the conventional white light emitting organic electroluminescent devices shown in FIGS. 1 and 2 acquire the white light by simply and sequentially disposing anodes A01 and B01 on substrates A10 and B10, disposing hole injection layers (HIL) A05 and B05, hole transport layers (HTL) A06 and B06, and a plurality of electroluminescent layers A07, A09, B07, B09, and B11, each including red, green, or blue light emitting substance, electron transport layers (ETL) A08 and B08, electron injection layers (EIL) A15 and B15, and cathodes A04 and B04.

The organic electroluminescent devices of FIGS. 1 and 2 emit light in the following procedure. When a voltage is applied to the space between the anode A01 or B01 and the cathode A04 or B04, holes injected from the anode pass through the hole transport layer A06 or B06 to the electroluminescent layers A07, A09, B07, B09, and B11. Electrons are injected from the cathode A04 or B04 through the electron transport layer A08 or B08 to the electroluminescent layers. Carriers are recombined in the interface and the bulk of the hole transport layer and the electroluminescent layers to thereby produce excitons.

The generated excitons are distributed to the respective electroluminescent layers and shift into the ground state. Thus, blue, green, and red colors are realized according to the colors of the electroluminescent layers and white light is emitted.

FIG. 3 shows a tandem organic electroluminescent device having a complicated multiple layer structure to increase efficiency according to the related art. When a voltage is applied, the organic electroluminescent device of FIG. 3 operates such that the number of electrons and holes injected to the anode C01 and the cathode C04 doubles by forming a p-type doped layer C20 and an n-type doped layer C21 out of the charge generation layer for additionally generating electrons and holes though a complicated doping process, or by forming a transparent anode, e.g., indium tin oxide (ITO), in the organic layer by using a sputtering method.

In short, the organic electroluminescent device of FIG. 3 includes a first element and a second element disposed in the anode on the substrate C10. The first element includes the hole injection layer C05, the hole transport layer C06a, the electroluminescent layer C07a, the electron transport layer C08a, and the n-type doped layer C20. The second element includes the p-type doped layer C21 or a transparent anode formed by using a sputtering method, the hole transport layer C06b, the electroluminescent layer C07b, the electron transport layer C08b, the electron injection layer C15, and the cathode C04.

Among the aforementioned conventional methods, the organic electroluminescent device of FIG. 1 that utilizes the complementary color relationship or the device of FIG. 2 having a simple stack structure where three primary color electroluminescent layers are stacked necessarily require two to three electroluminescent layers to realize white light in the organic layer used for injection and transfer of the electrons and holes. The organic electroluminescent device of FIG. 4 should properly distribute excitons generated in the three electroluminescent layers in the respect of a light emission mechanism.

In general, the organic electroluminescent device emits light and Joule heat caused by the emitted light, when voltage is applied thereto. The generation of Joule heat degrades the organic electroluminescent device and deteriorates its lifespan. A stack-type white device where electroluminescent layers of various colors are sequentially disposed undergoes remarkable lifespan deterioration as the number of electroluminescent layers increases.

The excitons produced by coupling between the holes and the electrons that are injected to the anode and the cathode when voltage is applied to the organic electroluminescent device exist in different areas according to the intensity of the applied voltage and current. This signifies that the light emission region is changed. The change in the light emission region becomes more distinctive when the number of electroluminescent layers is large. In the case of the conventional white light emitting device having a stack structure, the light emission spectrum of each color of RGB is changed as the intensity of the voltage or current becomes different. Therefore, the entire light emission color is changed.

The organic electroluminescent device is fabricated by performing doping onto the electroluminescent layers to increase the luminous efficiency. The doping process is a process for forming a layer by mixing a host material and a guest material. In the case where the layer is fluorescent, the portion generally occupied by the guest material reaches 1 to 10% of the entire materials. In the case where the layer is phosphorescent, it reaches 5 to 20% of the entire materials. With respect to the manufacturing process, doping is one of the most difficult processes, because an organic layer should be formed while the ratio of the small amount of the guest material is maintained. The presence of a different material in the electroluminescent layer changes the light emitting characteristic and reduces property reproducibility of the organic electroluminescent device. In the tandem white light emitting device shown in FIG. 3, the doping process is quite complicated, because doping should be performed onto the p-type doped layer (C20) and the n-type doped layer (C21) other than the electroluminescent layer, or sputtering for an anode should be performed onto an organic layer.

DISCLOSURE

[Technical Problem]

An exemplary embodiment of the present invention provides a highly efficient white light emitting organic electroluminescent device combining a first element including a reflective cathode and a second element including a transparent or translucent cathode in parallel.

[Technical Solution]

Another embodiment of the present invention provides a white light emitting organic electroluminescent device, which includes a transparent substrate, a first element, and a second element. The first element includes a first anode, a first element organic layer, and a reflective cathode sequentially disposed on a first substrate of the transparent substrate, and the second element includes a second anode, a second element organic layer, and a transparent or translucent cathode sequentially disposed on a second surface of the transparent substrate.

[Advantageous Effects]

The white light emitting organic electroluminescent device of the present invention can eliminate the color coordinate shift phenomenon by parallel combination of the light source. As a stable white light source, the organic electroluminescent device of the present embodiment can be applied to a high-quality color display. In addition, since the aging effect caused by heat generated from light emission is reduced by dividing electroluminescent layers, the electroluminescent device can have a long lifespan.

REFERENCE NUMERALS OF THE DRAWINGS

Figure 1:
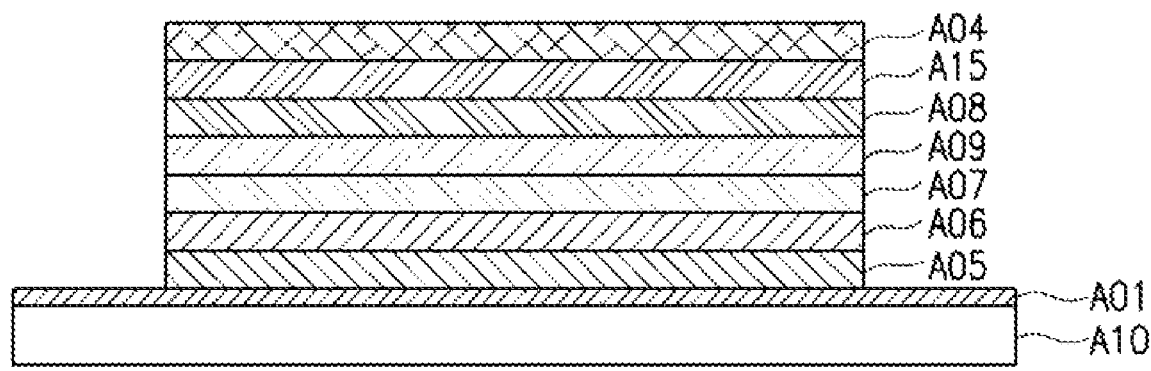
FIG. 1 is a cross-sectional view illustrating an example of a white light emitting organic electroluminescent device having a simple stack structure and realizing white light based on a combination of two complementary colors.
Figure 2:
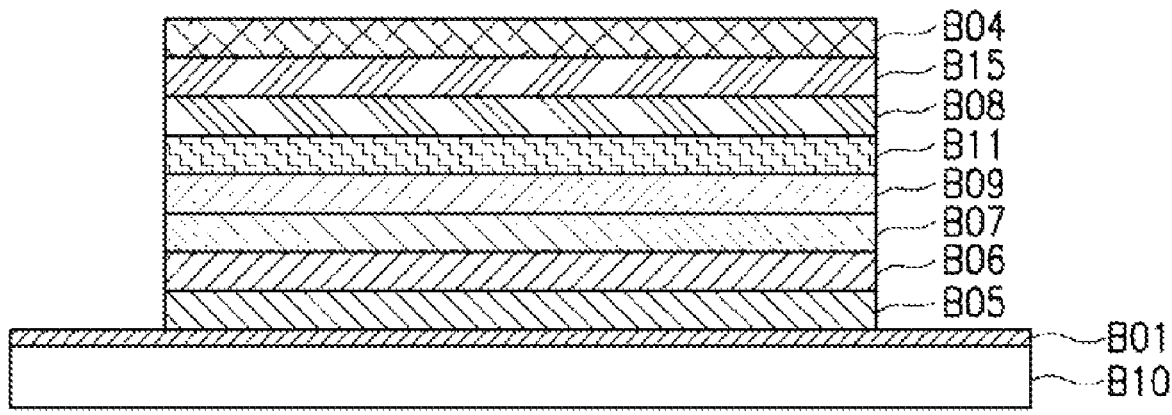
FIG. 2 is a cross-sectional view illustrating an example of a white light emitting organic electroluminescent device having a simple stack structure and realizing white light based on a three-color combination.
Figure 3:
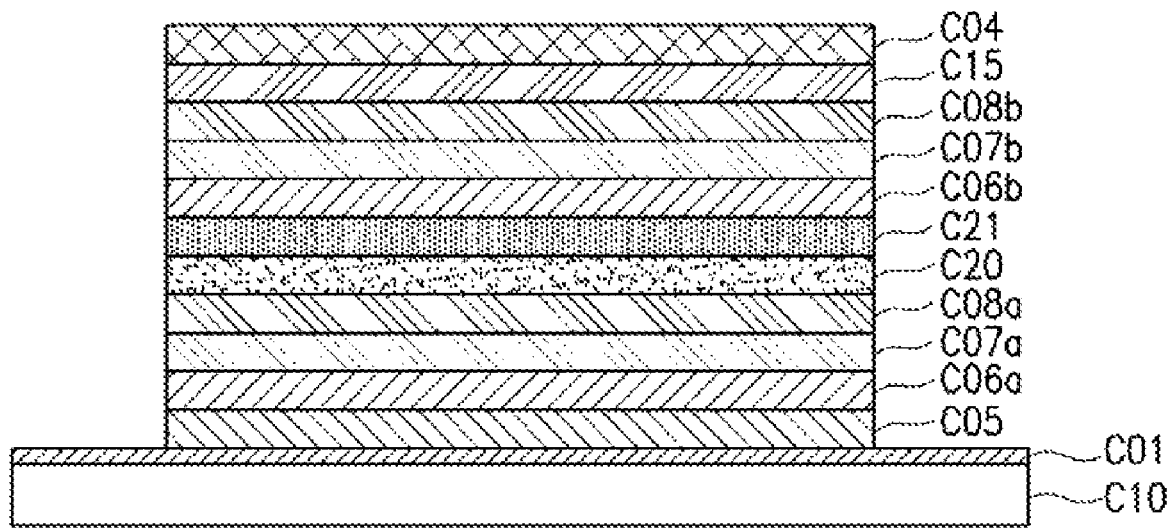
FIG. 3 is a cross-sectional view illustrating an example of a tandem white light emitting organic electroluminescent device having p-type and n-type doped layers.

A10, B10, C10, D10 . . . transparent substrate
A01, B01, C01, D01 . . . anode
A05, B05, C05, D05 . . . hole injection layer (HIL)
A06, B06, C06a, C06b, D06 . . . hole transport layer (HTL)
A07, A09, B07, B09, B11, C07a, C07b, D07, D09, D11 . . . electroluminescent layer (EML)
A08, B08, C08a, C08b, D08 . . . electron transport layer (ETL)
A15, B15, C15, D15 . . . electron injection layer
A04, B04, C04, D04 . . . cathode
C20 . . . p-type doped layer C21 . . . n-type doped layer
010 . . . transparent substrate
100, 100a, 100b, 100c, 100d . . . first element
200, 200a, 200b, 200c, 200d . . . second element
101 . . . first anode, 201 . . . second anode
102 . . . first insulation layer, 202 . . . second insulation layer
103, 103a, 103b, 103c, 103d . . . first element organic layer,
203, 203a, 203b, 203c, 203d . . . second element organic layer
104 . . . reflective cathode, 204 . . . transparent or translucent cathode
105 . . . first hole injection layer (HIL), 205 . . . second hole injection layer (HIL)

-continued

106 . . . first hole transport layer (HTL), 206 . . . second hole transport layer (HTL)
108 . . . first electron transport layer (ETL), 208 . . . second electron transport layer (ETL)
115 . . . first electron injection layer, 215 . . . second electron injection layer
107, 109, 111, 112 . . first electroluminescent layer (EML 1)
110, 206, 211 . . . second electroluminescent layer (EML 2)
209, 212, 213 . . . third electroluminescent layer (EML 3)
210 . . . fourth electroluminescent layer (EML 4)
220 . . . cathode protection layer

[Best Mode]

The present invention will be described more fully hereinafter with reference to the accompanying drawings, in which exemplary embodiments of the invention are shown. The present invention may be realized in diverse forms and it is not limited by the specific embodiments and examples described in the present specification.

The same reference numerals are used for the same constituent elements, although they appear in different drawings.

Figure 4:
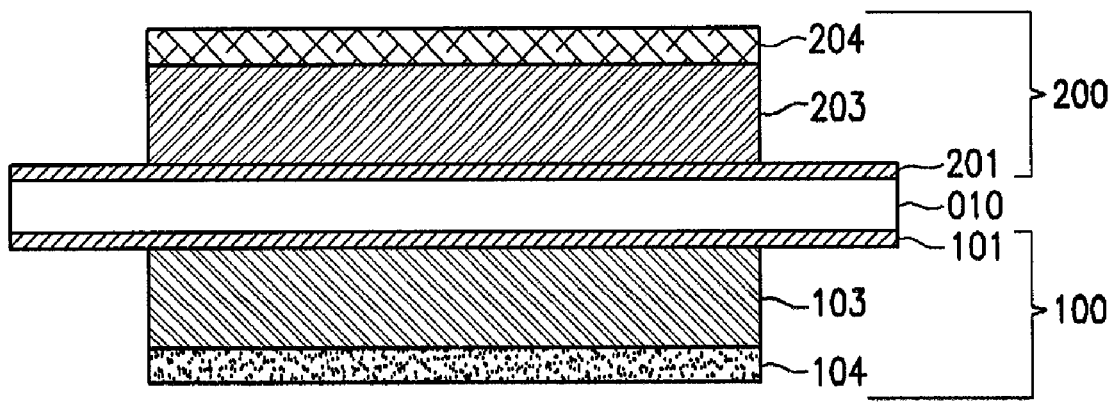
FIG. 4 is a cross-sectional view showing a structure of a white light emitting organic electroluminescent device according to an embodiment of the present invention.

FIG. 4 is a cross-sectional view showing a structure of a white light emitting organic electroluminescent device according to an embodiment of the present invention. Referring to FIG. 4, the white light emitting organic electroluminescent device 1 of the present invention includes a transparent substrate 010, a first element 100, and a second element 200. The first element includes a first anode 101, a first element organic layer 103, and a reflective cathode 104 sequentially stacked on a first surface of the transparent substrate 010. The second element 200 includes a second anode 201, a second element organic layer 203, and a transparent or translucent cathode 204 sequentially stacked on a second surface of the transparent substrate 010.

Figure 5:
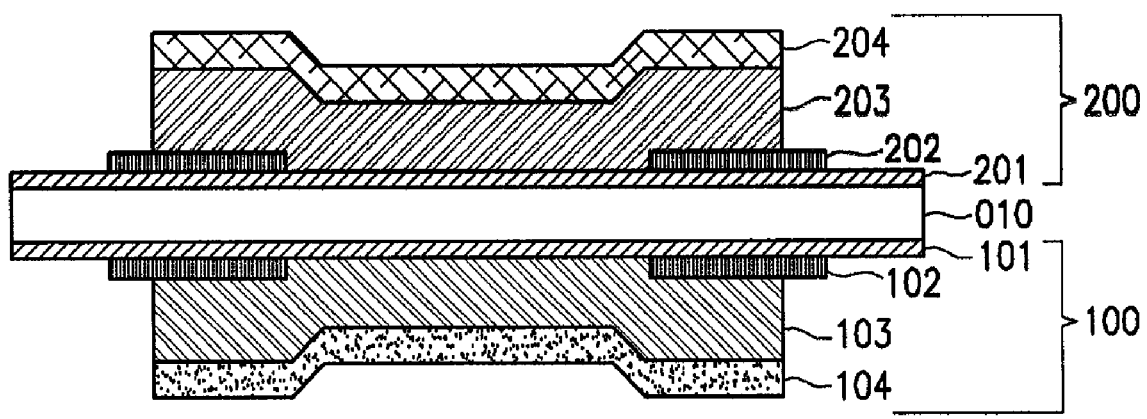
FIG. 5 is a cross-sectional view showing a structure of a white light emitting organic electroluminescent device further including a partially formed insulation layer according to an embodiment of the present invention.

Also, the first element 100 and the second element 200 of the white light emitting organic electroluminescent device 1 may further include a partially formed insulation layer 202 shown in FIG. 5 between the first anode and the first element organic layer and between the second anode and the second element organic layer, respectively. The insulation layer prevents short-circuits between the anode and cathode at the edge.

The white light emitting organic electroluminescent device 1 may further include a cathode protective layer for protecting the cathode of the second element.

According to an embodiment of the present invention, the first element organic layer 103 and the second element organic layer 203 include at least one electroluminescent layer selected from the group consisting of a red electroluminescent layer, a blue electroluminescent layer, a yellow electroluminescent layer, and a green electroluminescent layer, individually. The first element organic layer 103 and the second element organic layer 203 may include more than two electroluminescent layers of different colors.

Figure 6:
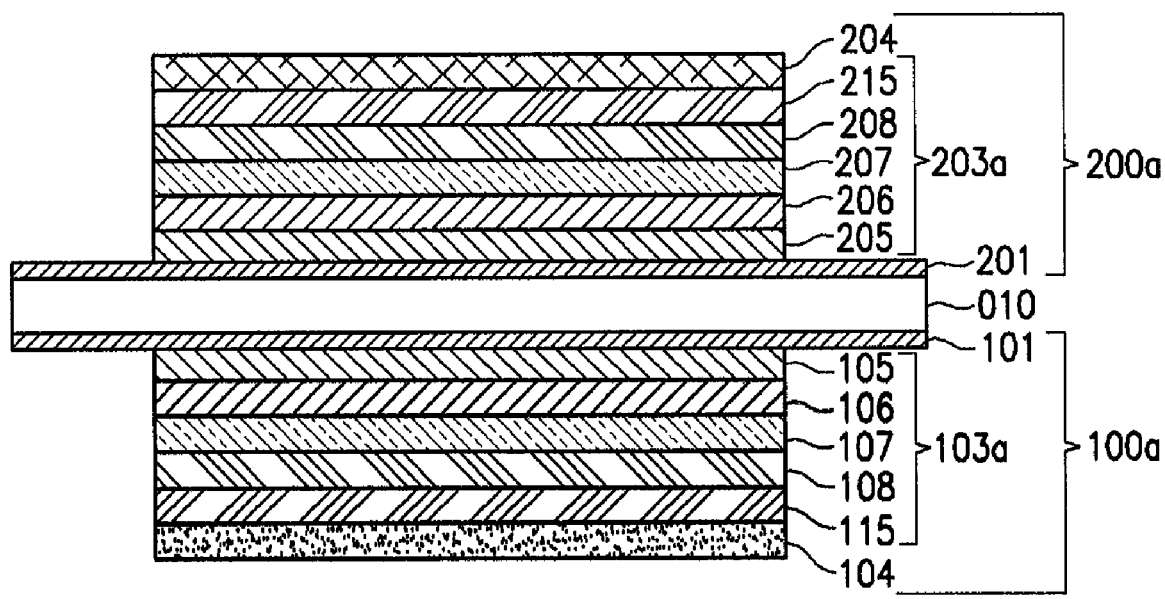
FIG. 6 is a cross-sectional view showing a white light emitting organic electroluminescent device according to a first embodiment of the present invention.

FIG. 6 is a cross-sectional view showing a white light emitting organic electroluminescent device according to a first embodiment of the present invention. Referring to FIG. 6, the white light emitting organic electroluminescent device includes a first element 100a and a second element 200a. The first element 100a includes a the first anode 101 disposed on a first surface of a transparent substrate 010, and a first hole transport layer (HTL) 105, a first hole injection layer (HIL) 106, a first electroluminescent layer 107, a first electron transport layer (ETL) 108, a first electron injection layer (EIL) 115, and a reflective cathode 104 that are sequentially disposed on the first anode 101. The second element 200a includes a second anode 201 disposed on a second surface of a transparent substrate 010, and a second hole transport layer 205, a second hole injection layer 206, a second electroluminescent layer 207, a second electron transport layer 208, a second electron injection layer 215, and a transparent or translucent cathode 204 sequentially disposed on the second anode 201. Herein, the first electron injection layer 115 and the second electron injection layer 215 may be excluded according to the material of the cathode.

According to an embodiment of the present invention, each of the first electroluminescent layer and the second electroluminescent layer is one single electroluminescent layer selected from the group consisting of a red electroluminescent layer, a green electroluminescent layer, a yellow electroluminescent layer, and a blue electroluminescent layer. The first electroluminescent layer and the second electroluminescent layer may be a green electroluminescent layer and a blue electroluminescent layer. Herein, the first electroluminescent layer and the second electroluminescent layer may emit different electroluminescent colors.

Figure 7:
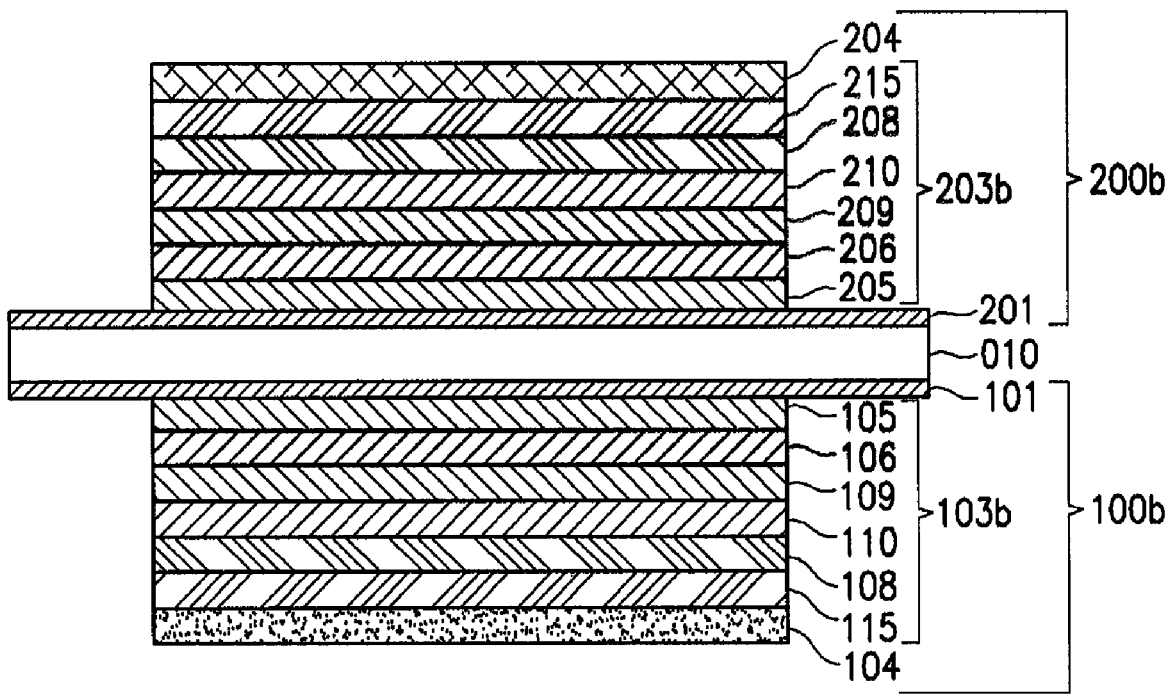
FIG. 7 is a cross-sectional view showing a white light emitting organic electroluminescent device according to a second embodiment of the present invention.

FIG. 7 is a cross-sectional view showing a white light emitting organic electroluminescent device according to a second embodiment of the present invention. Referring to FIG. 7, the white light emitting organic electroluminescent device of the present invention includes a first element 100b and a second element 200b. The first element 100b includes the first anode 101 disposed on the first surface of the transparent substrate 010, and the first hole transport layer 105, the first hole injection layer 106, a first electroluminescent layer 109, a second electroluminescent layer 110, the first electron transport layer 108, the first electron injection layer 115, and the reflective cathode 104 sequentially disposed on the first anode 101. The second element 200b includes the second anode 201 disposed on the second surface of the transparent substrate 010, and the second hole transport layer 205, the second hole injection layer 206, a third electroluminescent layer 209, a fourth electroluminescent layer 210, the second electron transport layer 208, the second electron injection layer 215, and the transparent or translucent cathode 204 sequentially disposed on the second anode 201. The first electron injection layer 115 and the second electron injection layer 215 may be excluded according to the material of the cathode.

Herein, at least one electroluminescent layer among the first to fourth electroluminescent layers may emit light of a different color from the colors of the other electroluminescent layers. The first and second electroluminescent layers may, respectively, emit light of blue and red, red and blue, blue and yellow, yellow and blue, green and red, or red and green. The third and fourth electroluminescent layers may, respectively, emit light of blue and red, red and blue, blue and yellow, yellow and blue, green and red, or red and green.

Figure 8:
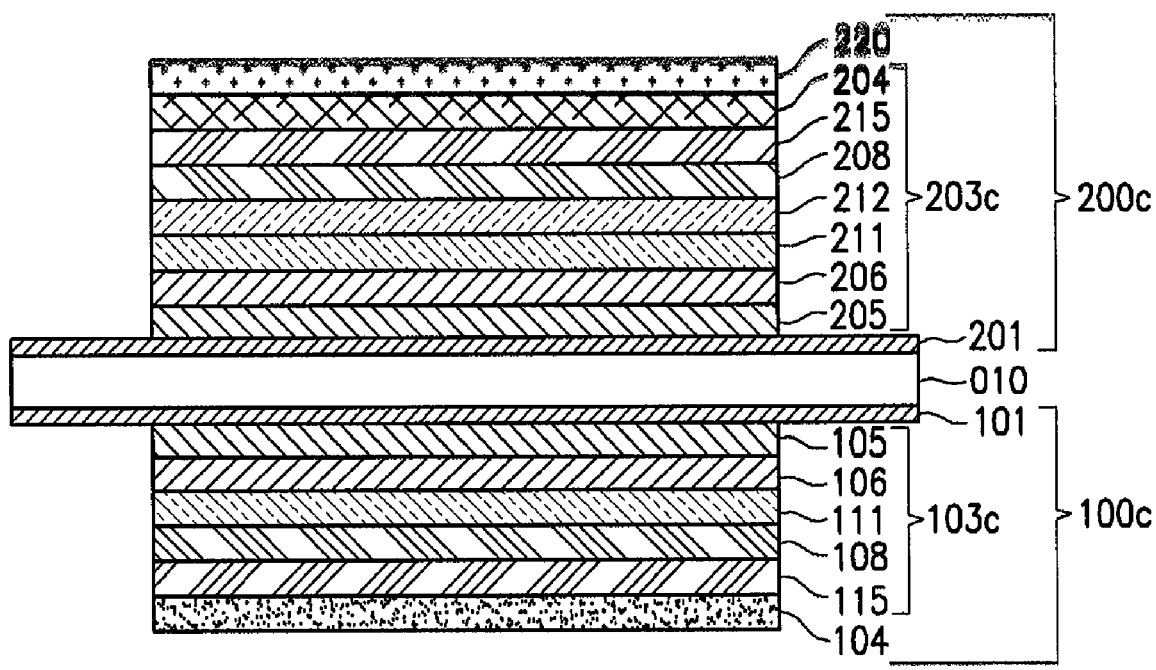
FIG. 8 is a cross-sectional view showing a white light emitting organic electroluminescent device according to a third embodiment of the present invention.
Figure 9:
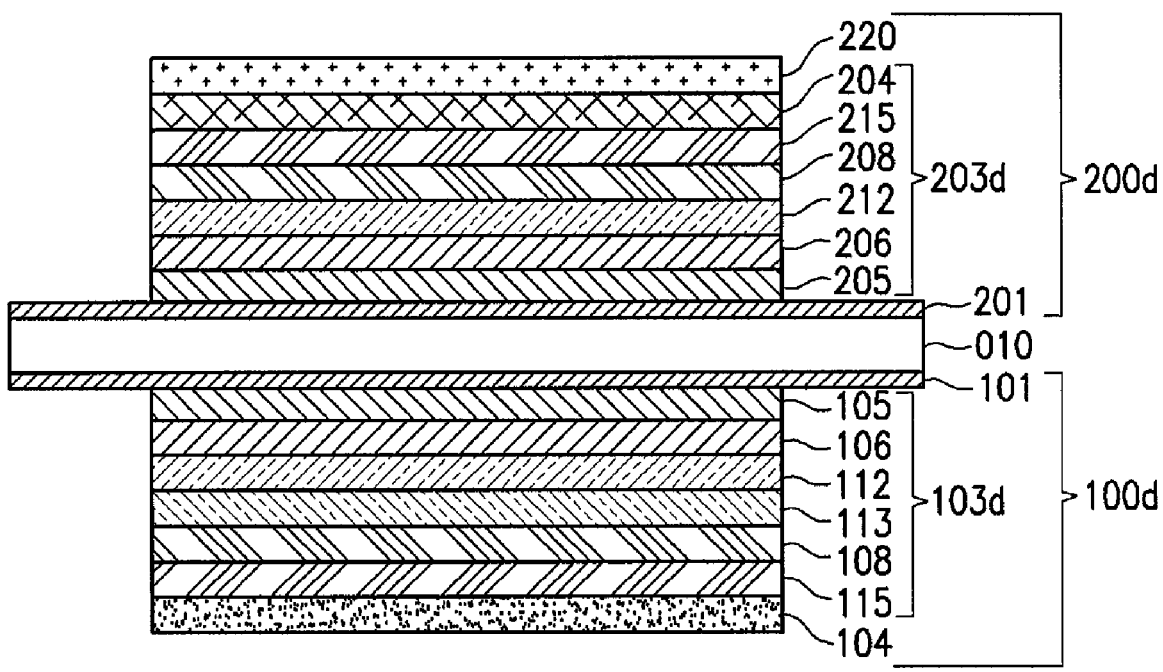
FIG. 9 is a cross-sectional view showing a white light emitting organic electroluminescent device according to a fourth embodiment of the present invention.

FIGS. 8 and 9 are cross-sectional views showing white light emitting organic electroluminescent devices according to third and fourth embodiments of the present invention, respectively.

Referring to FIG. 8, the white light emitting organic electroluminescent device of the present invention includes the first element 100c and the second element 200c. The first element 100c includes the first anode 101 disposed on the first surface of the transparent substrate 010, and the first hole transport layer 105, the first hole injection layer 106, a first electroluminescent layer 111, the first electron transport layer 108, the first electron injection layer 115, and the reflective cathode 104 sequentially disposed on the first anode 101. The second element 200c includes the second anode 201 disposed on the second surface of the transparent substrate 010, and the second hole transport layer 205, the second hole injection layer 206, a second electroluminescent layer 211, a third electroluminescent layer 212, the second electron transport layer 208, the second electron injection layer 215, and the transparent or translucent cathode 204 sequentially disposed on the second anode 201. A cathode protection layer 220 may be further disposed to protect the second device 200c. The first electron injection layer 115 and the second electron injection layer 215 may be excluded according to the material of the cathode.

Referring to FIG. 9, the white light emitting organic electroluminescent device of the present invention includes the first element 100d and the second element 200d. The first element 100d includes the first anode 101 disposed on the first surface of the first anode 101, and the first hole transport layer 105, the first hole injection layer 106, a first electroluminescent layer 112, a second electroluminescent layer 113, the first electron transport layer 108, the first electron injection layer 115, and the reflective cathode 104 sequentially disposed on the first anode 101. The second element 200d includes the second anode 201 disposed on the second surface of the transparent substrate 010, and the second hole transport layer 205, the second hole injection layer 206, a third electroluminescent layer 213, the second electron transport layer 208, the second electron injection layer 215, and the transparent or translucent cathode 204 sequentially disposed on the second anode 201. A cathode protection layer 220 may be further disposed to protect the second device 200d. The first electron injection layer 115 and the second electron injection layer 215 may be excluded according to the material of the cathode.

In the third and fourth embodiments, the first electroluminescent layer is any one selected from the group consisting of a red electroluminescent layer, a blue electroluminescent layer, a yellow electroluminescent layer, and a green electroluminescent layer. The second electroluminescent layer is one selected from the group consisting of the other layers except the one selected as the first electroluminescent layer. The third electroluminescent layer is one selected from the group consisting of the other layers except the ones selected as the first and second electroluminescent layers.

The first to fourth embodiments provide specific examples of white light emitting organic electroluminescent devices based on the parallel combination, which is suggested in the present invention, and it is obvious to those skilled in the art of the present invention that white light emitting organic electroluminescent devices having the other structures by modifying the number, kind, and positions of electroluminescent layers belong to the scope of the present invention can be produced.

The materials for forming the constituent elements of the white light emitting organic electroluminescent devices can be arbitrarily selected among the materials used for conventional white light emitting organic electroluminescent devices, and they are not limited to specific ones. However, the respective constituent elements may include the following materials to have excellent effects.

The transparent substrate may be any substrate that is generally used for conventional organic electroluminescent devices and appropriately selected according to the use of the device. The substrate may be a transparent glass substrate or a transparent plastic substrate with excellent transparency, surface flatness, and water-repellency, and which can be handled easily.

The first and second anodes included in the organic electroluminescent device may be arbitrarily selected from conventional anode materials. Specifically, they may include at least one selected from the group consisting of indium tin oxide (ITO), tin oxide ($SnO_2$), and zinc oxide (ZnO), which are transparent and have excellent conductivity. The thickness ranges of the first anode and the second anode may be determined according to need. The thicknesses are not limited to specific ranges, but they may be thicker than 100 Å to obtain sufficient light emission characteristics and thinner than 2000 Å to acquire excellent light transmission characteristics, and they are more specifically from 1000 to 2000 Å.

The hole injection layer and hole transport layer disposed on the first and second anodes are formed of a material having a triphenylamine group with hole transporting properties such as at least one selected from the group consisting of 4,4',4''-tris(N-3-methylphenyl-N-phenyl-amino)-triphenylamine (m-MTDATA), and N,N-bis(naphthalene-1-yl)phenyl)-N,N-bis(phenyl)benzidine (NPB).

The thickness ranges of the hole injection layer and hole transport layer may be determined according to need. The thicknesses are not limited to specific ranges, but the hole injection layer disposed in the first element and the second element may have a thickness ranging from 400 Å to 1500 Å to obtain sufficient light emission characteristics, and the hole transport layer disposed in the first element and the second element may have a thickness ranging from 100 Å to 500 Å.

Each electroluminescent layer of the organic electroluminescent device includes a light emitting host material that is generally used in an organic electroluminescent device. According to one embodiment, it may be selected from the group consisting of aluminum tris(8-hydroxyquinilone) (Alq3) for emitting green, red, or yellow depending on a dopant, 4,4'-bis(carbazole-9-yl)biphenyl (CBP) for emitting green, and 4,4'-bis(2,2-diphenyl-ethene-1-yl)-diphenyl (DPVBi), 4,4''-bis (2,2-diphenylvinyl-1-yl)-p-terphenylene (DPVTP) and Spiro-DPVBi for emitting blue. The electroluminescent layer may include blue light emitting dopants having a smaller energy gap than host materials such as phenylene-based or distylene amine-based compounds.

Each electroluminescent layer may be formed to have a thickness ranging from 100 Å to 500 Å according to the extent of their contribution to white light emission. The range may be changed according to the characteristics of the material used.

The electroluminescent layers may be formed by co-depositing the light emitting host material and the dopants in a predetermined ratio to increase the efficiency of the electroluminescent layers and change colors.

The dopant makes it possible for the hole-electron combination to induce energy transfer between the host and the guest and thus emit light. Examples of the dopants include fluorescent dopants selected from Coumarin 6 for emitting green, rubrene for emitting yellow, 4-dicyanomethylene)-2-methyl-6-(p-dimethylaminostyryl)-4H-pyran (DCM) and 4-(dicyanomethylene)-2-tert-butyl-6-(1,1,7,7-tetramethyljuloridyl-9-enyl)-4H-p yran (DCJTB) for emitting red; and perylene, quinacridone, and DCM2 for emitting blue, phosphorescent dopants selected from 2,3,7,8,12,13,17,18-octaethyl-21H,23H-phorphine platinum (PtOEP) for emitting red, and iridium(III)bis[ (4,6-di-fluorophenyl)-pyridinato-N, C2']picolinate (Firpic) for emitting blue. One or more of these dopants may be included in each electroluminescent layer.

The doping concentration of the dopant may be selected in an appropriate range for a CIE index of the white light emitting spectrum of the white light emitting organic electroluminescent device. According to one embodiment, the doping concentration may range from 1 to 20 parts by weight with respect to 100 parts by weight of the light emitting host. Particularly, when the dopant is a fluorescent dopant, the doping concentration may range from 1 to 10 parts by weight with respect to 100 parts by weight of the light emitting host due to a light emitting mechanism. When the dopant is a phosphorescent dopant, the doping concentration may range from 5 to 20 parts by weight with respect to 100 parts by weight of the light emitting host due to a light emitting mechanism.

The electron transport layer disposed in the first element and the second element may include a generally-used metal complex, specifically, a metal complex such as Alq3, to transport electrons. However, the material for the electron transport layers may not be limited to the above example in the white light emitting organic electroluminescent device of the present invention. The electron transport layers may have a thickness ranging from 50 Å to 300 Å with respect to the electron transport capability, individually.

The electron injection layers are disposed in the first element and the second element to allow the electrons to be injected smoothly. The electron injection layers include an alkali metal having a small work function. The alkali metal may be at least one selected from the group consisting of lithium, calcium, magnesium, and cesium.

When the reflective cathode of the first element includes an alkali metal having a small work function, the alkali metal included in the cathode substantially plays the role of the electron injection layer. Thus, the first electron injection layer may be excluded. When the transparent or translucent cathode of the second element includes an alkali metal having a small work function, the second electron injection layer may be excluded.

The electron injection layer including the alkali metal may be formed in a thickness ranging from 100 Å to 500 Å by co-depositing the material of the electron transport layer with the alkali metal, or in a thickness ranging from 5 Å to 20 Å by depositing at least one lithium salt such as lithium fluoride and lithium benzoate.

The cathode included in the white light emitting organic electroluminescent device, which is suggested in the embodiment of the present invention, includes a conventional metal material for forming a cathode. Specifically, the cathode may include at least one selected from the group consisting of lithium (Li), magnesium (Mg), silver (Ag), aluminum (Al), aluminum-lithium (Al—Li), calcium (Ca), magnesium-indium (Mg—In), and magnesium-silver (Mg—Ag).

Particularly, the reflective cathode included in the first element may have a thickness ranging from 500 Å to 5000 Å, and the transparent or translucent cathode included in the second element may have a thickness ranging from 80 Å to 350 Å. Calcium may be included at a thickness of 50 Å to 150 Å, and silver (Ag) may be included at a thickness of 50 Å to 200 Å.

To increase the transparency and conductivity of the transparent or translucent cathode, the metal cathode having a thickness of 50 Å to 100 Å is coated with at least one transparent metal oxide selected from the group consisting of indium tin oxide (ITO), tin oxide ($SnO_2$), and zinc oxide (ZnO). The transparent metal oxide coating may be thicker than 1000 Å for high transparency and conductivity, and is more specifically from 1000 Å to 5000 Å in thickness.

Also, the cathode protective layer that may be used to protect the cathode of the second element, other than the transparent metal oxide, may be a cathode protective layer used for a conventional organic electroluminescent device, and it is not limited to a specific one. However, the cathode may include a material having excellent scattered oxygen barrier characteristics such as silicon nitride, silicon oxide, and organic metal complexes.

Also, the thickness of the cathode protective layer induces a cavity effect, which is desirable, and it may be thicker than 1000 Å to block moisture and oxygen, and it more specifically ranges from 1000 Å to 10,000 Å.

Hereinafter, examples will be described to evaluate the performance of the white light emitting organic electroluminescent device according to the present invention. However, these are presented only for better understanding of the present invention, and the present invention is not limited thereto.

EXAMPLES

Example 1

ITO electrodes, which were used as the first anode and the second anode, were disposed in the upper and lower surfaces of a transparent glass substrate at a thickness of 1800 Å. To fabricate the first element, m-MTDATA was formed as the first hole injection layer at a thickness of 600 Å, and NPB was formed as the first hole transport layer at a thickness of 150 Å on the first anode.

The first electroluminescent layer was formed at a thickness of 300 Å by co-depositing Alq3 as the light emitting host and DCM as a dopant on the upper part of the first hole transport layer. The content of Alq3 was 95 wt %, and the content of DCM was 5 wt %.

Subsequently, the fabrication of the first element was completed by disposing Alq3 at a thickness of 300 Å as the first electron transport layer, LiF at a thickness of 10 Å as the first electron injection layer, and Al at a thickness of 2000 Å as the reflective cathode, sequentially.

A transparent cathode having optical transparency of over 80% for the second element was fabricated in the same method as in the fabrication of the first element by depositing m-MTDATA at a thickness of 600 Å as the second hole transport layer, NPB at a thickness of 150 Å as the second hole injection layer, DPVBi at a thickness of 300 Å as a blue electroluminescent layer, and Alq3 at a thickness of 300 Å as a second electron transport layer on the upper part of the second anode, and sequentially depositing calcium at a thickness of 80 Å, and silver at a thickness of 100 Å thereon.

A cathode protective layer was formed on the second element to protect the cathode from moisture and oxygen and induce the cavity effect by forming layers of LiF and Alq3 at a thickness of 1000 Å, individually.

FIG. 8 shows a cross-section of the organic electroluminescent device according to Example 1. Since the transparent cathode of the second element included calcium, the second electron injection layer 215 shown in FIG. 8 was excluded.

Figure 10:
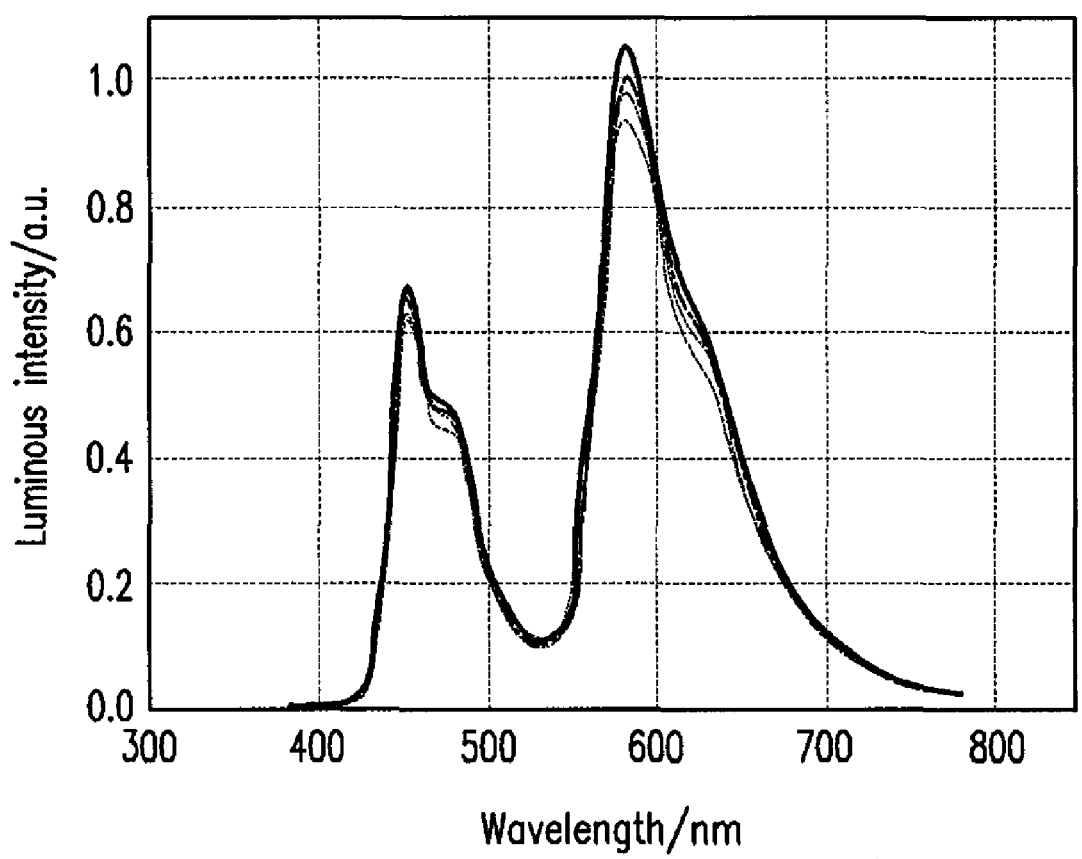
FIG. 10 shows a light emitting spectrum of the white light emitting organic electroluminescent device according to Example 1 of the present invention.

The spectrum of the organic electroluminescent device fabricated according to Example 1 was measured and is presented in FIG. 10. The following Table 1 shows characteristics of the organic electroluminescent device measured at current densities of 11 $mA/cm^2$, 25 $mA/cm^2$, 50 $mA/cm^2$, and 100 $mA/cm^2$.

TABLE 1

| Current density (mA/cm$^2$) | Voltage (V) | Luminance (cd/m$^2$) | Color Coordinates (x, y) | Peak Wavelength (nm) R | G | B | Luminous Efficiency (cd/A) | Electric Power Efficiency (lm/W) |
|---|---|---|---|---|---|---|---|---|
| 10 | 7.4 | 548 | 0.305, 0.312 | 581 | — | 452 | 5.5 | 2.3 |
| 25 | 8.8 | 1350 | 0.304, 0.313 | 581 | — | 452 | 5.4 | 1.9 |
| 50 | 9.8 | 2652 | 0.303, 0.315 | 582 | — | 452 | 5.3 | 1.7 |
| 100 | 10.7 | 5443 | 0.302, 0.318 | 582 | — | 452 | 5.4 | 1.6 |

According to the spectrum and characteristics of the organic electroluminescent device shown in FIG. 10 and Table 1, red and blue wavelength peaks appeared at 581 nm and 452 nm, and the light emitted from the red electroluminescent layer of the first element was reflected by the reflective cathode and mixed with the light emitted from the blue electroluminescent layer of the second element to thereby produce white light at color coordinates (0.305, 0.312) through the transparent cathode.

Herein, as shown in Table 1, the organic electroluminescent device showed a luminous efficiency of 5.5 cd/A and electric power efficiency of 2.3 lm/W at 10 mA/cm$^2$. The color coordinates shifted by (−0.003, +0.006) as the current density applied to the organic electroluminescent device was increased from 10 mA/cm$^2$ to 100 mA/cm$^2$. This is similar to a color shift phenomenon occurring in an organic electroluminescent device having a single electroluminescent layer, and it shows that the white light emitting organic electroluminescent device of the present invention has a very stable white light emitting characteristic.

Example 2

ITO electrodes, which were used as the first anode and the second anode, were disposed on the upper and lower surfaces of a transparent glass substrate at a thickness of 1800 Å. To fabricate the first element, m-MTDATA was formed as the first hole injection layer at a thickness of 600 Å, and NPB was formed as the first hole transport layer at a thickness of 150 Å on the first anode.

DPVBi was formed as a blue electroluminescent layer on top of the first hole transport layer at a thickness of 200 Å, and a 95 wt % Alq3 host and a 5 wt % DCM dopant were co-deposited as a red electroluminescent layer at a thickness of 150 Å.

Subsequently, the fabrication of the first element was completed by disposing Alq3 at a thickness of 250 Å as the first electron transport layer, LiF at a thickness of 10 Å as the first electron injection layer, and Al at a thickness of 2000 Å as the reflective cathode, sequentially.

A transparent cathode having an optical transparency of over 85% for the second element was fabricated in the same method as in the fabrication of the first element by depositing m-MTDATA at a thickness of 600 Å as the second hole transport layer, NPB at a thickness of 150 Å as the second hole injection layer, a mixture obtained by co-depositing a 98 wt % Alq3 host and a 2 wt % Coumarin 6 dopant at a thickness of 300 Å as a green electroluminescent layer, and Alq3 at a thickness of 250 Å as a second electron transport layer on the upper part of the second anode, and sequentially depositing calcium at a thickness of 50 Å and silver at a thickness of 110 Å thereon.

A cathode protective layer was formed in the second element to protect the cathode from moisture and oxygen and induce the cavity effect by forming layers of LiF and Alq3 at a thickness of 1000 Å, individually.

FIG. 9 shows a cross-section of the organic electroluminescent device according to Example 2. Since the transparent cathode of the second element included calcium, the second electron injection layer 215 shown in FIG. 9 was excluded.

Figure 11:
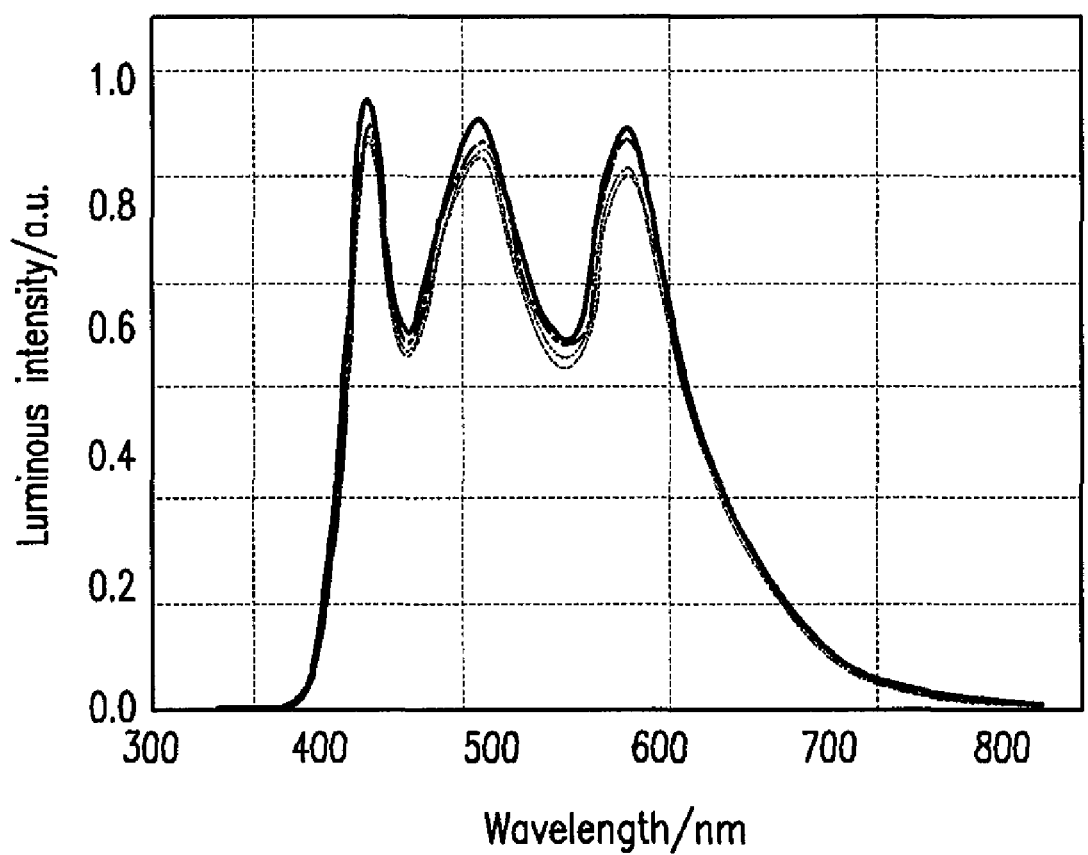
FIG. 11 shows a light emitting spectrum of the white light emitting organic electroluminescent device according to Example 2 of the present invention.

The spectrum of the organic electroluminescent device fabricated according to Example 2 was measured and is presented in FIG. 11. The following Table 2 shows characteristics of the organic electroluminescent device measured at current densities of 11 mA/cm$^2$, 25 mA/cm$^2$, 50 mA/cm$^2$, and 100 mA/cm$^2$.

TABLE 2

| Current density (mA/cm$^2$) | Voltage (V) | Luminance (cd/m$^2$) | Color Coordinates (x, y) | Peak Wavelength (nm) R | G | B | Luminous Efficiency (cd/A) | Electric Power Efficiency (lm/W) |
|---|---|---|---|---|---|---|---|---|
| 10 | 8.0 | 589 | 0.341, 0.373 | 581 | 510 | 455 | 5.9 | 2.3 |
| 25 | 9.2 | 1475 | 0.342, 0.375 | 581 | 510 | 455 | 5.9 | 2.0 |
| 50 | 10.1 | 2956 | 0.343, 0.376 | 582 | 511 | 455 | 5.9 | 1.8 |
| 100 | 11.1 | 5934 | 0.344, 0.379 | 582 | 511 | 455 | 5.9 | 1.7 |

According to the spectrum and characteristics of the organic electroluminescent device shown in FIG. 11 and Table 2, blue, green, and red wavelength peaks appeared at 455 nm, 511 nm, and 581 nm, and the light emitted from the red electroluminescent layer of the first element was reflected by the reflective cathode and mixed with the light emitted from the blue electroluminescent layer of the second element to thereby produce white light at color coordinates (0.341, 0.373) through the transparent cathode.

Herein, as shown in Table 2, the organic electroluminescent device showed a luminous efficiency of 5.9 cd/A and electric power efficiency of 2.3 lm/W at 10 mA/cm$^2$. The color coordinates shifted by (+0.003, +0.006) as the current density applied to the organic electroluminescent device was increased from 10 mA/cm² to 100 mA/cm². This signifies that the white light involves the red, green, and blue color wavelengths while maintaining stable color reproducibility, and it can provide high color reproducibility when it is used as a light source for a full-color organic electroluminescent device.

Comparative Example 1

For comparison with Examples 1 and 2, a white light emitting organic electroluminescent device involving the red, green, and blue wavelengths was fabricated in a conventional stack structure, and the characteristics were measured.

Figure 12:
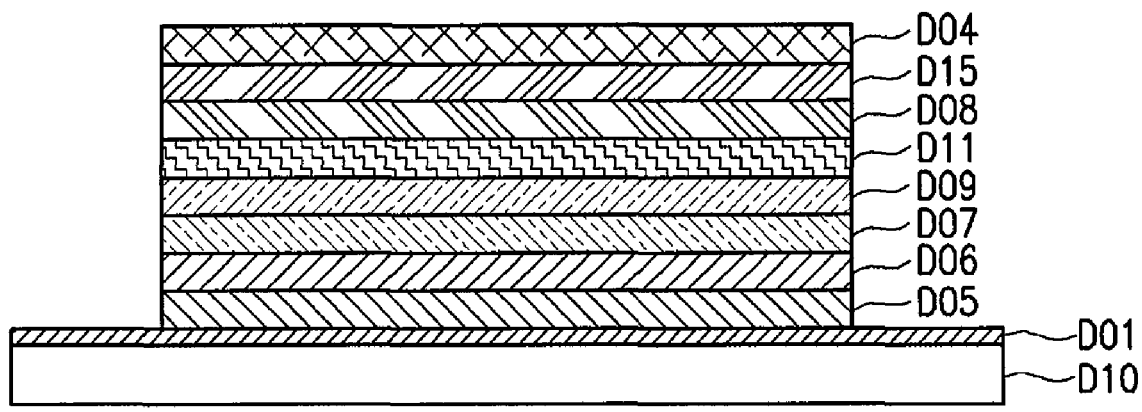
FIG. 12 is a cross-sectional view showing a white light emitting organic electroluminescent device according to Comparative Example 1.

To compare the characteristics of the examples and the comparative example, an organic electroluminescent device shown in FIG. 12 was fabricated by applying all the same materials, doping concentration, and vacuum fabrication conditions. Referring to FIG. 12, fabrication process is described in detail.

ITO D01, which was an anode, was formed at a thickness of 800 Å on a transparent glass substrate D10, and a hole injection layer D05 was formed at a thickness of 600 Å thereon by depositing m-MTDATA under a vacuum condition. Subsequently, a hole transport layer D06 was formed at a thickness of 150 Å by depositing NPB on top of the hole injection layer D05 under the vacuum condition.

Subsequently, electroluminescent layers emitting the three primary colors, i.e., red, green, and blue, were formed by co-depositing 95 wt % Alq3 and 5 wt % DCM as the red electroluminescent layer D07 at a thickness of 100 Å, co-depositing 98 wt % Alq3 and 2 wt % Coumarin 6 as the green electroluminescent layer D09 at a thickness of 100 Å, and depositing DPVBi as the blue electroluminescent layer D11 at a thickness of 150 Å on the hole transport layer D06.

Alq3 was vacuum-deposited as the electron transport layer D08 at a thickness of 250 Å, and LiF and Al were deposited as the electron injection layer D15 and the cathode D04 at a thickness of 10 Å and 2000 Å, respectively, to thereby complete the fabrication of an organic electroluminescent device.

Figure 13:
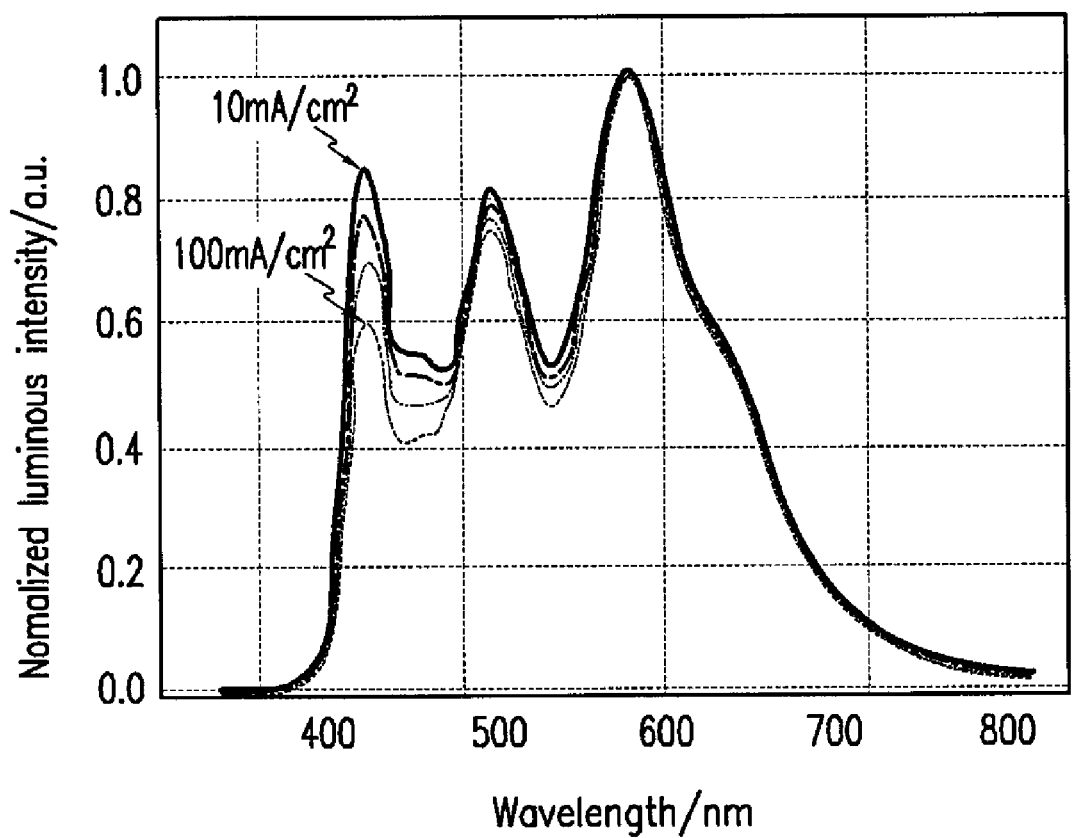
FIG. 13 shows a light emitting spectrum of the white light emitting organic electroluminescent device according to Comparative Example 1 of the present invention.

The spectrum of the organic electroluminescent device fabricated according to Comparative Example 1 was measured and is presented in FIG. 13. The following Table 3 shows characteristics of the organic electroluminescent device measured at current densities of 11 mA/cm², 25 mA/cm², 50 mA/cm², and 100 mA/cm².

According to the spectrum and characteristics of the organic electroluminescent device shown in FIG. 13 and Table 3, blue, green, and red wavelength peaks appeared at 452 nm, 517 nm, and 582 nm, and the lights emitted from the simply stacked R, G, and B electroluminescent layers were mixed to be white light having color coordinates (0.340, 0.373).

Herein, as shown in Table 3, the organic electroluminescent device showed a luminous efficiency of 4.2 cd/A and electric power efficiency of 1.8 lm/W at 10 mA/cm². The color coordinates shifted from (0.340, 0.373) to (0.355, 0.415) as the current density applied to the organic electroluminescent device was increased from 10 mA/cm² to 100 mA/cm².

As described above, excitons generated from coupling between holes and electrons in the conventional organic electroluminescent device having a simple stack structure exist in a different area according to the applied voltage and current intensity. This signifies that the light emitting region changes.

The light emitting region changes more, as the number of electroluminescent layers increases. As shown in the spectrum of FIG. 13, the contribution of blue light emission decreases remarkably as the current density increases.

Therefore, it can be seen that the organic electroluminescent devices of Examples 1 and 2 have improved luminous efficiency of 140% and electric power efficiency of 128%, compared to the organic electroluminescent device of Comparative Example 1.

Figure 14:
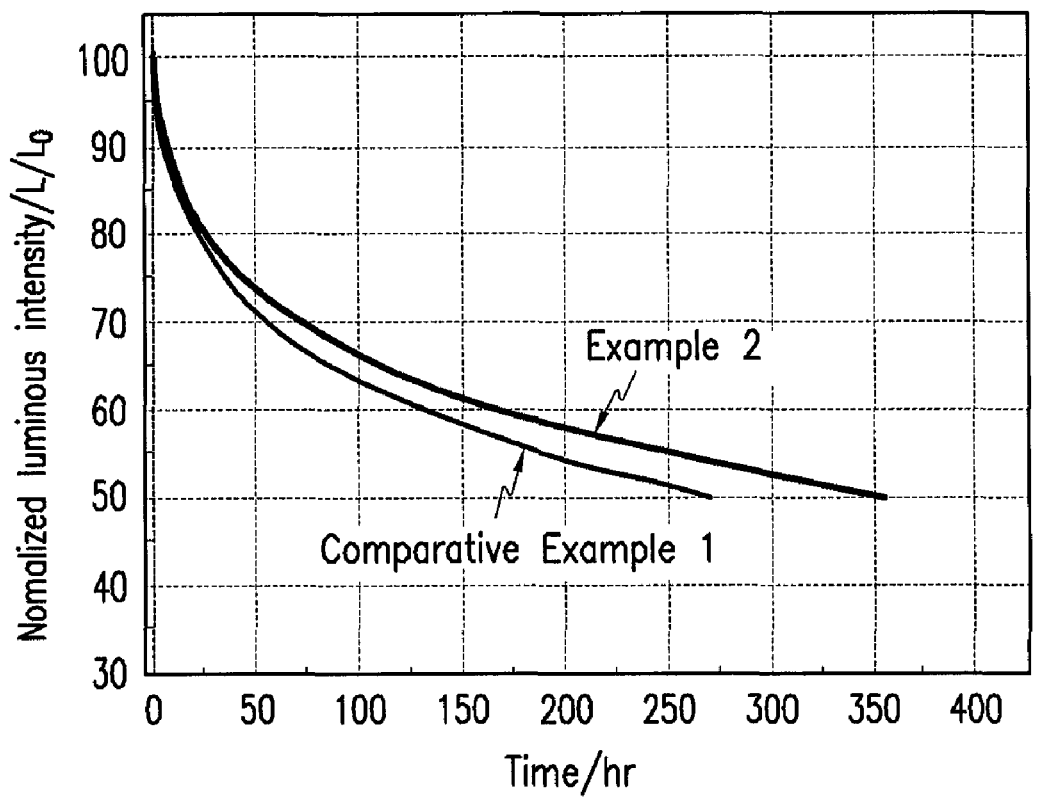
FIG. 14 shows lifespan of the white light emitting organic electroluminescent devices according to Example 2 of the present invention and Comparative Example 1.

FIG. 14 shows luminous lifetime of the white light organic electroluminescent devices fabricated according to Example 2 and Comparative Example 1, and Table 4 presents color coordinate shifts of the white light organic electroluminescent devices fabricated according to Example 2 and Comparative Example 1 according to aging.

FIG. 14 is a graph showing a half life reduction time, which is defined as time taken for the initial luminance ($L_0$) to drop by 50% when the following conditions were maintained: 23° C., moisture 10 ppm, and oxygen 5 ppm.

It can be seen from FIG. 11 that the organic electroluminescent device fabricated according to Example 2 had a half life reduction time of 355 hours when the initial luminance was 1000 cd/m². On the other hand, the white light emitting organic electroluminescent device fabricated according to Comparative Example 1 had a half life reduction time of 355 hours. Therefore, it can be concluded that the white light emitting organic electroluminescent device fabricated according to Example 2 has a lifespan that is improved by 130%, compared to the white light emitting organic electroluminescent device fabricated according to Comparative Example 1.

TABLE 3

| Current density (mA/cm²) | Voltage (V) | Luminance (cd/m²) | Color Coordinates (x, y) | Peak Wavelength (nm) | | | Luminous Efficiency (cd/A) | Electric Power Efficiency (lm/W) |
| --- | --- | --- | --- | --- | --- | --- | --- | --- |
| | | | | R | G | B | | |
| 10 | 7.4 | 423 | 0.340, 0.373 | 582 | 517 | 452 | 4.2 | 1.8 |
| 25 | 8.9 | 1075 | 0.343, 0.386 | 582 | 517 | 452 | 4.3 | 1.5 |
| 50 | 10.0 | 2155 | 0.348, 0.399 | 583 | 517 | 452 | 4.3 | 1.4 |
| 100 | 11.2 | 4372 | 0.355, 0.415 | 583 | 517 | 453 | 4.4 | 1.2 |

TABLE 4

| | Example 2 | | Comparative Example 1 | |
|---|---|---|---|---|
| Time (hr) | luminance (cd/m$^2$) | color coordinate (x, y) | luminance (cd/m$^2$) | color coordinate (x, y) |
| fresh | 1000 | 0.341, 0.373 | 1000 | 0.340, 0.373 |
| 30 | 788 | 0.341, 0.373 | 765 | 0.343, 0.382 |
| 80 | 721 | 0.342, 0.374 | 661 | 0.345, 0.389 |
| 140 | 622 | 0.343, 0.375 | 589 | 0.348, 0.395 |
| 180 | 591 | 0.343, 0.375 | 556 | 0.351, 0.398 |
| 220 | 564 | 0.344, 0.375 | 528 | 0.356, 0.410 |
| 270 | 537 | 0.344, 0.375 | 501 | 0.358, 0.420 |
| 320 | 514 | 0.345, 0.377 | — | — |
| 350 | 502 | 0.346, 0.377 | — | — |

To have a look at the color coordinate shifts based on aging shown in Table 4, the red, green, and blue primary colors decrease uniformly in the organic electroluminescent device of Example 2, as the organic electroluminescent device ages. The initial white color coordinates (0.341, 0.373) are maintained at similar levels, and when almost the half life reduction time passes, i.e., 350 hours, the color coordinates are changed to (0.346, 0.377).

On the contrary, in the organic electroluminescent device of Comparative Example 1, the initial white color coordinates (0.340, 0.373) move to (0.358, 0.420) in 270 hours, which is almost a half life reduction time, due to a drastic reduction in luminous efficiency of the blue electroluminescent layer. In short, the white light remarkably changes toward yellow and orange.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A white light emitting organic electroluminescent device, comprising:
   a transparent substrate;
   a first element including a first anode, a first element organic layer, and a reflective cathode sequentially disposed on a first substrate of the transparent substrate; and
   a second element including a second anode, a second element organic layer, and a transparent or translucent cathode sequentially disposed on a second surface of the transparent substrate.

2. The white light emitting organic electroluminescent device of claim 1, wherein the first element organic layer and the second element organic layer comprise at least one electroluminescent layer selected from the group consisting of a red electroluminescent layer, a blue electroluminescent layer, a yellow electroluminescent layer, and a green electroluminescent layer, and
   the electroluminescent layers disposed in the respective first element organic layer and the second element organic layer emit light of at least two different colors.

3. The white light emitting organic electroluminescent device of claim 2, wherein the first element organic layer comprises a first hole injection layer, a first hole transport layer, a first electroluminescent layer, and a first electron transport layer sequentially stacked on top of the first anode,
   the second element organic layer comprises a second hole injection layer, a second hole transport layer, a second electroluminescent layer, and a second electron transport layer sequentially stacked on top of the second anode, and
   the first electroluminescent layer and the second electroluminescent layer emit light of different colors.

4. The white light emitting organic electroluminescent device of claim 2, wherein the first element organic layer comprises a first hole injection layer, a first hole transport layer, a first electroluminescent layer, a second electroluminescent layer, a first electron transport layer, and a reflective cathode sequentially stacked on top of the first anode,
   whereas the second element organic layer comprises a second hole injection layer, a second hole transport layer, a third electroluminescent layer, a fourth electroluminescent layer, a second electron transport layer, and a transparent or translucent cathode sequentially stacked on top of the second anode, and
   at least one among the first to fourth electroluminescent layers emits light of a different color from the colors of the other electroluminescent layers.

5. The white light emitting organic electroluminescent device of claim 2, wherein the first element organic layer comprises a first hole injection layer, a first hole transport layer, a first electroluminescent layer, a first electron transport layer, and a reflective cathode sequentially stacked on top of the first anode,
   whereas the second element organic layer comprises a second hole injection layer, a second hole transport layer, a second electroluminescent layer, a third electroluminescent layer, a second electron transport layer, and a transparent or translucent cathode sequentially stacked on top of the second anode, and
   the first electroluminescent layer is one selected from the group consisting of a red electroluminescent layer, a blue electroluminescent layer, a yellow electroluminescent layer, and a green electroluminescent layer, whereas the second electroluminescent layer is one selected from the group except the one selected as the first electroluminescent layer, and the third electroluminescent layer is the remaining one.

6. The white light emitting organic electroluminescent device of claim 2, wherein the first element organic layer comprises a first hole injection layer, a first hole transport layer, a first electroluminescent layer, a second electroluminescent layer, a first electron transport layer, and a reflective cathode sequentially stacked on top of the first anode,
   whereas the second element organic layer comprises a second hole injection layer, a second hole transport layer, a third electroluminescent layer, a second electron transport layer, and a transparent or translucent cathode sequentially stacked on top of the second anode, and
   the first electroluminescent layer is one selected from the group consisting of a red electroluminescent layer, a blue electroluminescent layer, a yellow electroluminescent layer, and a green electroluminescent layer, whereas the second electroluminescent layer is one selected from the group except the one selected as the first electroluminescent layer, and the third electroluminescent layer is the remaining one.

7. The white light emitting organic electroluminescent device of claim 3, wherein the first element organic layer further comprises a first electron injection layer between the first electron transport layer and the reflective cathode, or
   the second element organic layer further comprises a second electron injection layer between the second electron transport layer and the transparent or translucent cathode, or the first element organic layer and the second element organic layer further comprise the first electron injection layer and the second electron injection layer.

8. The white light emitting organic electroluminescent device of claim 4, wherein the first element organic layer further comprises a first electron injection layer between the first electron transport layer and the reflective cathode, or the second element organic layer further comprises a second electron injection layer between the second electron transport layer and the transparent or translucent cathode, or the first element organic layer and the second element organic layer further comprise the first electron injection layer and the second electron injection layer.

9. The white light emitting organic electroluminescent device of claim 5, wherein the first element organic layer further comprises a first electron injection layer between the first electron transport layer and the reflective cathode, or the second element organic layer further comprises a second electron injection layer between the second electron transport layer and the transparent or translucent cathode, or the first element organic layer and the second element organic layer further comprise the first electron injection layer and the second electron injection layer.

10. The white light emitting organic electroluminescent device of claim 6, wherein the first element organic layer further comprises a first electron injection layer between the first electron transport layer and the reflective cathode, or the second element organic layer further comprises a second electron injection layer between the second electron transport layer and the transparent or translucent cathode, or the first element organic layer and the second element organic layer further comprise the first electron injection layer and the second electron injection layer.

11. The white light emitting organic electroluminescent device of claim 1, wherein the second element further comprises a cathode protective layer on top of the transparent or translucent cathode.

12. The white light emitting organic electroluminescent device of claim 2, wherein the second element further comprises a cathode protective layer on top of the transparent or translucent cathode.

13. The white light emitting organic electroluminescent device of claim 3, wherein the second element further comprises a cathode protective layer on top of the transparent or translucent cathode.

14. The white light emitting organic electroluminescent device of claim 4, wherein the second element further comprises a cathode protective layer on top of the transparent or translucent cathode.

15. The white light emitting organic electroluminescent device of claim 5, wherein the second element further comprises a cathode protective layer on top of the transparent or translucent cathode.

16. The white light emitting organic electroluminescent device of claim 6, wherein the second element further comprises a cathode protective layer on top of the transparent or translucent cathode.

* * * * *